United States Patent [19]

Fujimaru et al.

[11] Patent Number: 5,246,898
[45] Date of Patent: Sep. 21, 1993

[54] DIELECTRIC CERAMICS

[75] Inventors: Takuya Fujimaru, Miyazaki; Masamitsu Nishida, Osaka; Koichi Kugimiya, Osaka, all of Japan

[73] Assignee: Matsushita Electric Industrial Co., Ltd., Osaka, Japan

[21] Appl. No.: 973,601

[22] Filed: Nov. 9, 1992

Related U.S. Application Data

[63] Continuation of Ser. No. 686,067, Apr. 16, 1991, abandoned.

[30] Foreign Application Priority Data

Apr. 19, 1990 [JP] Japan ................................. 2-103491
Sep. 25, 1990 [JP] Japan ................................. 2-255792

[51] Int. Cl.$^5$ ............................................. C04B 35/00
[52] U.S. Cl. .................................. 501/135; 501/108; 501/121; 501/123
[58] Field of Search ................ 501/135, 108, 121, 123

[56] References Cited

U.S. PATENT DOCUMENTS 4,121,941 10/1978 Kawashima et al. .............. 106/39.5
4,487,842 12/1984 Nomura et al. .................... 501/135
4,731,207 3/1988 Matsumoto et al. ................. 264/25

FOREIGN PATENT DOCUMENTS 274816    1/1990  German Democratic Rep. .
53-60544  5/1978  Japan .
61-181008 8/1986  Japan .
62-170102 7/1987  Japan .
1-19604   1/1989  Japan .

OTHER PUBLICATIONS

S. Kawashima, et al., "Ba(Zn$_{\frac{1}{3}}$Ta$_{\frac{2}{3}}$)O$_3$ Ceramics With Low Dielectric Loss at Microwave Frequencies", Journal of the American Ceramic Society, vol. 66-6 (1983), pp. 421–423.

Search Report dated Aug. 6, 1991 of corres. European Pat. Appln. 911062636.

*Primary Examiner*—Mark L. Bell
*Assistant Examiner*—Deborah Jones
*Attorney, Agent, or Firm*—Panitch Schwarze Jacobs & Nadel

[57] ABSTRACT

High-frequency dielectric ceramics which contains the oxide of a complex perovskite structure as the main component, have a mean crystal gain size of sintered ceramic controlled to within the range of 5 μm to 20 μm and a porosity not exceeding 7% and provides high unloaded Q without requiring long-hour sintering or heat treatment.

18 Claims, 5 Drawing Sheets

Fig. 5

DIELECTRIC CERAMICS

This is a continuation of U.S. Ser. No. 07/686,067, filed Apr. 16, 1991, now abandoned.

BACKGROUND OF THE INVENTION

1. Field of the Invention

The present invention relates to dielectric ceramics, and more particularly to dielectric ceramics having high unloaded Q (reciprocal of dielectric loss) in high frequency ranges such as microwaves, millimetric waves, etc.

2. Description of the Prior Art

Generally, high-frequency dielectric ceramics are widely used as dielectric resonators, substrates for monolithic integrated circuits (MICs), etc.

In recent years, the frequency range used has been expanding to a higher range as the satellite broadcasting and satellite communications using the super high frequency band (SHF band) enters an era of practical use, which has spurred the need for the development of dielectric ceramics having a higher unloaded Q.

Ba-Mg-Ta based dielectric ceramics (as disclosed in U.S. Pat. Nos. 4,121,941, 4,487,842, 4,731,207, Japanese Laid-Open Patent Publication No. 61-181008, and Japanese Laid-Open Patent Publication No. 62-170102) have been drawing attention as dielectric ceramics having a high unloaded Q.

High-frequency dielectric ceramics containing a Ba-Mg-Ta based complex perovskite compound as the main component have poor sintering characteristics. Therefore, in the conventional Ba-Mg-Ta system, it has only been possible to obtain a low unloaded Q of 3,740 to 3,920 at the frequency of 11 GHz (U.S. Pat. No. 4,121,941).

In view of the above difficulty, there has been proposed a method which comprises adding Mn as a sintering agent to improve the sintering characteristics (U.S. Pat. No. 4,487,842). This method, indeed, is capable of producing dielectric ceramics having an unloaded Q of 10,000 or larger (at frequency of 11 GHz), but adding such a dissimilar element as Mn not only leads to complication of the manufacturing process but also entails the possibility of causing a detrimental effect on the dielectric properties of the ceramics because of the addition of such an agent.

Furthermore, there has been proposed a special sintering method called a rapid heating method (a method capable of heating up quickly to the desired temperature) aiming at improving the sintering characteristics (U.S. Pat. No. 4,731,207). With this method, it is possible to improve the unloaded Q factor, but because of the difference in thermal contraction between the exterior and interior of the ceramics and other reasons, the reproducibility of unloaded Q is particularly poor, making it difficult to obtain products of stable quality. To deal with this problem, a method has been proposed which comprises covering the compact with refractory powder during heating and sintering (Japanese Laid-Open Patent Publication No. 61-181008), but it cannot be said that this method succeeded in basically solving the problem.

When Ba is denoted as A, Mg as B1 and Ta as B2, for example, the oxide of a complex perovskite structure can be represented by the formula A (B1, B2) $O_3$.

In dielectric ceramics containing the oxide of a complex perovskite structure as the main component, it is known that when the crystal structure is hexagonal, the structure takes the shape of periodic arrangement (long-range periodic arrangement) repeating over a wide range with three layers as one cycle, i.e. in the order of B1-B2-B2 in the above formula; therefore, the lattice contracts along the direction perpendicular to the (111) direction, causing strain.

It is also said that the unloaded Q factor is improved as the lattice strain is caused, as described above, as a result of the improved regularity of the long-range periodic arrangement. Therefore, in order to improve the regularity and obtain ceramics having high unloaded Q, it has been the usual practice to sinter ceramics prepared from fine powder of a mean crystal grain size of 1 to 2 $\mu$m, followed by over-100 hours sintering and over-100 hours heat treatment.

However, such a sintering method has had the disadvantage of an increased sintering cost and a complicated manufacturing process, thus presenting obstacles to the improvement of production efficiency (S. Kawashima et al., J. Am. Ceram. Soc., 66(6) pp421-(1983)).

Also, when the rapid heating method is used to obtain ceramics of high density and heat treatment of extremely long duration is performed to enhance the regularity, it is possible to obtain ceramics of high unloaded Q, but such a technique also has had the shortcomings of complicating the manufacturing process and presenting obstacles to the improvement of production efficiency (Japanese Laid-Open Patent Publication No. 62-170102).

SUMMARY OF THE INVENTION

The dielectric ceramic of the present invention, which overcomes the above-discussed and numerous other disadvantages and deficiencies of the prior art, contains as its main component the oxide of a complex perovskite structure and having a mean crystal grain size of sintered ceramic controlled to within the range of 5 $\mu$m to 20 $\mu$m and a porosity not exceeding 7%.

In an embodiment, the oxide of the complex perovskite structure consists essentially of a compound represented by the formula: Ba $[(Mg_xZn_{1-x})_{\frac{1}{3}}(Nb_yTa_{1-y})_{\frac{2}{3}}]O_3$, wherein $0 \leq x \leq 1$, $0 \leq y \leq 1$.

In an embodiment, the oxide of the complex perovskite structure consists essentially of a compound represented by the formula: $uBaO \cdot v[xMgO, (1-x)ZnO] \cdot w[YNb_2O_5, (1-Y)Ta_2O_5]$, wherein $0 \leq x \leq 1$, $0 \leq y \leq 1$, $0.585 \leq u \leq 0.620$, $0.160 \leq v \leq 0.220$, $0.195 \leq w \leq 0.220$, and $u+v+w=1$.

Alternatively, the dielectric ceramic of the present invention contains as its main component a complex perovskite compound consisting essentially of BaO, MgO, and $Ta_2O_5$, the composition range thereof being in the range of 48.1 to 48.8% by weight for BaO and in the range of 3.6 to 4.5% by weight for MgO, and the remaining percentage for $Ta_2O_5$ in the range of 46.7 to 48.3% by weight.

Alternatively, the dielectric ceramic of the present invention contains as its main component a complex perovskite compound consisting essentially of BaO, MgO, and $Ta_2O_5$, the composition range thereof being in the range of 48.3 to 48.8% by weight for BaO and in the range of 3.8 to 4.3% by weight for MgO, and the remaining percentage for $Ta_2O_5$ in the range of 46.9 to 47.7% by weight.

Thus, the invention described herein makes possible the following objectives:

(1) The present invention stably provides high-frequency dielectric ceramics which contains the oxide of a complex perovskite structure as the main component and provides high unloaded Q, overcoming the above-discussed shortcomings, that is, without requiring long-hour sintering or heat treatment.

(2) The present invention provides dielectric ceramics which contain the oxide of a complex perovskite structure as the main component, and in the sintered ceramics, the mean crystal grain size is controlled to within the range of 5 μm to 20 μm and the porosity not exceeding 7%; therefore, unlike conventional dielectric ceramics, there is no need to perform sintering for long hours to regulate B1 and B2 ions and cause the lattice strain. As a result, a drastic reduction can be achieved in manufacturing costs including energy costs, and in the material properties, dielectric ceramics having a higher unloaded Q than the conventional ones can be manufactured stably. Such effects are especially remarkable in the dielectric ceramics containing as the main component the oxide of the complex perovskite structure represented by the formula $Ba[(Mg_xZn_{1-x})_{\frac{1}{3}}(Nb_yTa_{1-y})_{\frac{2}{3}}]O_3$, wherein $0 \leq x \leq 1$, $0 \leq y \leq 1$. This is also true of the dielectric ceramics having as the main component an oxide represented by the formula $uBaO \cdot v[xMgO, (1-x)ZnO] \cdot w[YNb_2O_5, (1-Y)Ta_2O_5]$, wherein $0 \leq x \leq 1$, $0 \leq y \leq 1$, $0.585 \leq u \leq 0.620$, $0.160 \leq v \leq 0.220$, $0.195 \leq w \leq 0.220$, and $u+v+w=1$.

(3) Using dielectric ceramics which contain a complex perovskite compound as the main component and are therefore hard to sinter, dielectric ceramics having a stable quality and a high unloaded Q can be manufactured by a conventional sintering method without using a sintering agent or a special sintering technique and without requiring a long-hour heat treatment.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

High purity $BaCO_3$, $MgO$, $Ta_2O_5$, $ZnO$, and $Nb_2O_5$ were weighed out so that the ceramics of the compositions I and II shown in Table 1 could be obtained, and the thus weighed materials were wet-mixed using a ball mill.

The resulting mixture was pre-sintered at 1,000° to 1,200° C. for two hours, after which the mixture was wet-ground using a ball mill, followed by dehydration and drying.

After that, a binder was added to the resulting powder to control the grain size thereof, and the thus prepared powder was dry-pressed at a pressure of 1,000 kg/cm² to form into a disk with a diameter of 7.5 mm and a thickness of 4.0 mm. The thus formed compacts were then sintered under the sintering conditions (at a heating/cooling rate of 200° C./h) as shown in Table 1 to produce the sample ceramics.

Table 1-1 shows the compositions and the mean crystal grain size and porosity obtained under each sintering condition. In the table, the sample numbers marked with "*" indicate the samples outside the scope of the present invention.

TABLE 1-1

| Composition | Sample Nos | Sintering temperature − sintering hour | mean crystal grain size (μm) | Porosity (%) |
|---|---|---|---|---|
| I | *1 | 1550° C. −2 h | 1.5 | 1.6 |
|  | *2 | 1580° C. −2 h | 2.0 | 2.2 |
|  | 3 | 1590° C. −2 h | 12.5 | 2.7 |
|  | 4 | 1600° C. −2 h | 17.5 | 2.8 |
|  | *5 | 1350° C. 120 h | 1.3 | 1.1 |
| II | *6 | 1600° C. −2 h | 0.1 | 1.4 |
|  | *7 | 1600° C. −4 h | 1.0 | 1.3 |
|  | 8 | 1600° C. −6 h | 6.0 | 1.5 |
|  | 9 | 1600° C. −12 h | 9.5 | 1.8 |
|  | 10 | 1600° C. −24 h | 15.0 | 2.0 |
|  | *11 | 1600° C. 120 h | 24.0 | 8.5 |
|  |  | 1600° C. 120 h | 24.0 | 8.5 |
|  | *12 | 1600° C. −1 h + 1450° C. 120 h | 0.1 | 1.0 |

Composition I is $Ba[Zn_{\frac{1}{3}}(Nb_{0.17}Ta_{0.83})_{\frac{2}{3}}]O_3$, and Composition II is $Ba_{0.99}(Mg_{\frac{1}{3}}Ta_{\frac{2}{3}})O_n$ (n; arbitrary number.)

The mean crystal grain size was obtained by the line intercept method using an optical photomicroscope of a ceramic cross section which was chemically etched after being polished to a mirror surface. The porosity was obtained by calculation from the density of an actual sample and a theoretical density calculated from the crystal lattice constant obtained by X-ray diffraction.

Table 1-2 shows the degree of regularity and the electrical characteristics. In the table, the sample numbers marked with "*" indicate the samples outside the scope of the present invention.

TABLE 1-2

| Composition | Sample Nos | Degree of regularity | unloaded Q | Relative dielectric constant $\epsilon_r$ | Temperature characteristic τf (ppm/°C.) |
|---|---|---|---|---|---|
| I | *1 | 2.25 | 10100 | 31.0 | 1.1 |
|  | *2 | 2.15 | 12200 | 30.8 | 1.2 |
|  | 3 | 2.00 | 17800 | 30.5 | 0.8 |
|  | 4 | 1.80 | 20000 | 30.5 | 0.7 |
|  | *5 | 3.21 | 13100 | 30.9 | 1.0 |
| II | *6 | 8.06 | 18000 | 25.4 | 4.6 |
|  | *7 | 8.05 | 18400 | 25.4 | 4.3 |
|  | 8 | 8.06 | 22000 | 25.1 | 4.5 |
|  | 9 | 8.07 | 25000 | 25.1 | 4.5 |
|  | 10 | 8.05 | 27000 | 24.9 | 3.9 |
|  | *11 | 8.06 | 16300 | 21.3 | 15.3 |

TABLE 1-2-continued

| Composition | Sample Nos | Degree of regularity | unloaded Q | Relative dielectric constant $\epsilon r$ | Temperature characteristic $\tau f$ (ppm/°C.) |
| --- | --- | --- | --- | --- | --- |
| | *12 | 8.06 | 19600 | 25.5 | 4.8 |

The relative dielectric constant ($\epsilon r$), unloaded Q, and temperature characteristic ($\tau f$) of resonant frequency shown for each sample ceramic are the values measured after polishing the sample to give a resonant frequency of 10 GHz to 12 GHz. The temperature characteristic ($\tau f$) of resonant frequency is the variation of the resonant frequency against the variation of the sample temperature.

The degree of regularity was calculated using the following equation.

$$\text{Degree of regularity} = \frac{(I_{100})}{(I_{110, 102})} \times 100$$

In the above equation, ($I_{100}$) represents the intensity of the diffraction line from (100) plane, which is the strongest diffraction line of the superlattice lines appearing as a result of the regularity, and ($I_{110, 102}$) represents the intensity of the diffraction line from (110, 102) plane, which is the strongest diffraction line of the diffraction lines observed regardless of the presence or absence of the regularity. This means that a higher state of the regularity is achieved as the degree of regularity becomes higher.

Figure 1:
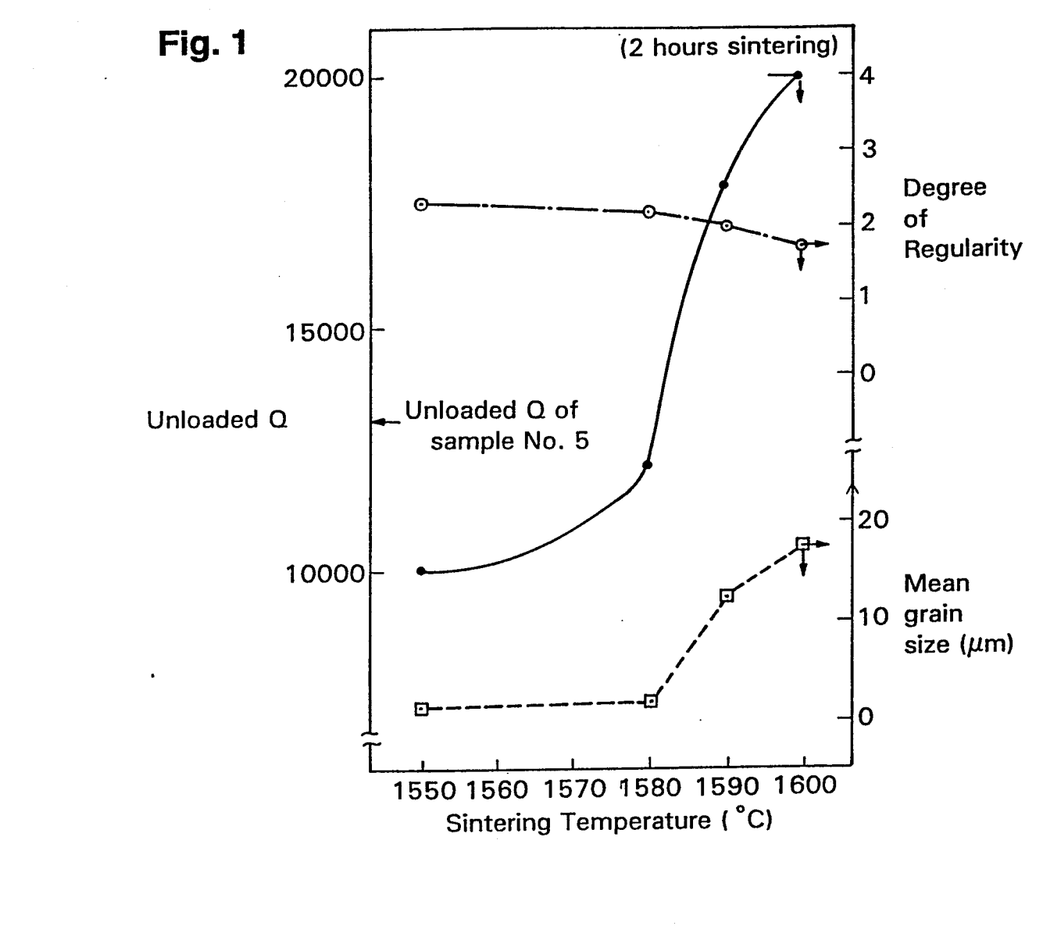
FIG. 1 is a diagram showing the relationship between the sintering temperature, mean crystal grain size, unloaded Q, and degree of regularity concerning samples prepared in accordance with one embodiment of the dielectric ceramics of the present invention.

FIG. 1 shows the relationship between the sintering temperature, mean crystal grain size (dotted line), unloaded Q (solid line), and degree of regularity (dashed line) of the samples No. 1 to No. 4.

Figure 2:
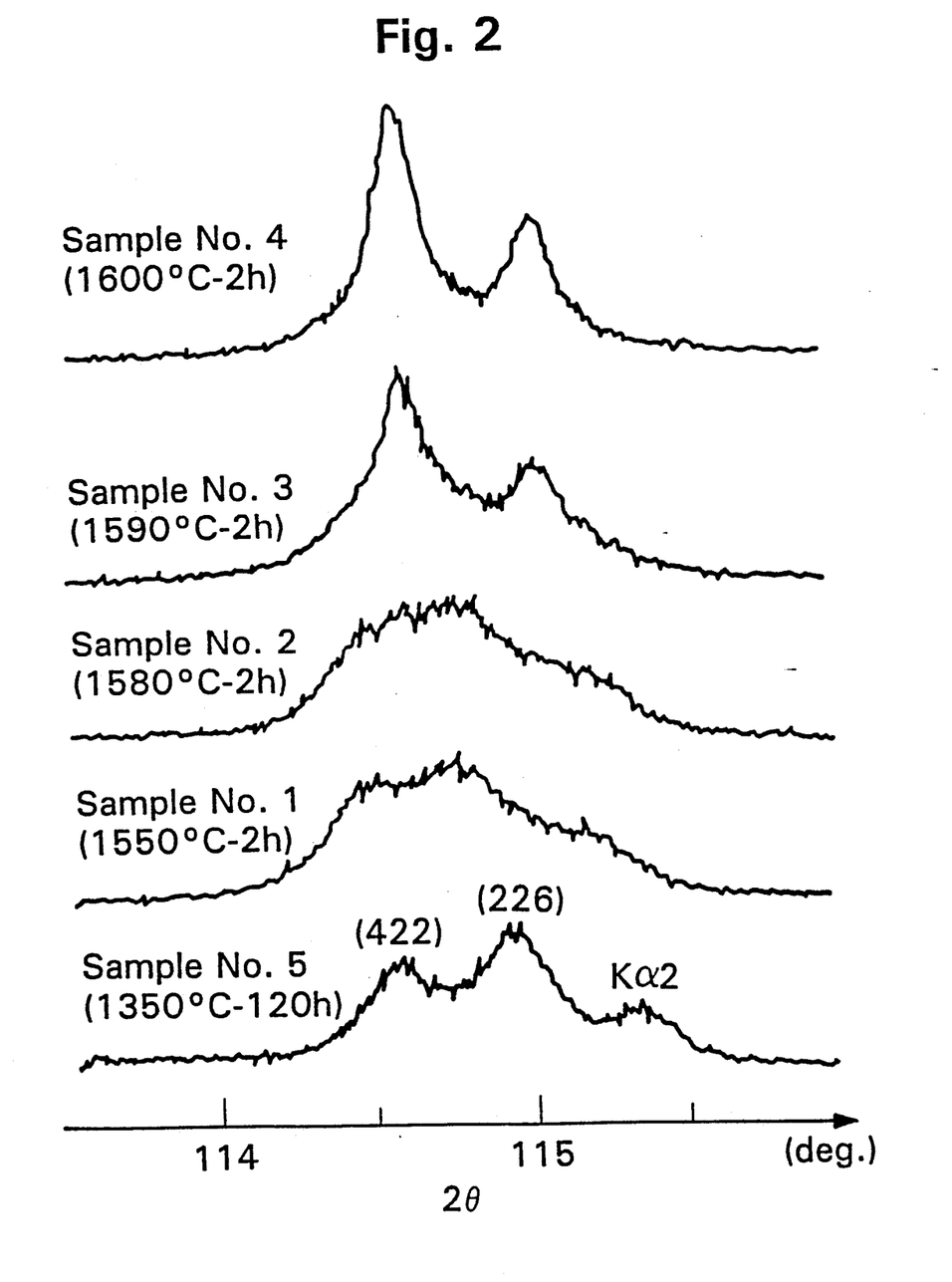
FIG. 2 is a diagram showing the X-ray diffraction patterns of (422) and (226) planes of the powder samples of FIG. 1 treated at typical sintering temperatures.

FIG. 2 shows the results of the examination by X-ray diffraction on the lattice strain associated with the degree of regularity. FIG. 2 shows the X-ray diffraction patterns of (422), (226) planes of the samples of FIG. 1 (sintered under typical sintering conditions). In the X-ray diffraction analysis, in order to evaluate the deviation of the c/a (c: lattice constant of c-axis, a: lattice constant of a-axis) from $(3/2)^{\frac{1}{2}}$, the diffraction line from the corresponding (422) plane was observed in terms of separation from the diffraction line from (226) plane. It can be seen from the diffraction patterns that if the lattice is not strained, the c/a is equal to $(3/2)^{\frac{1}{2}}$, with the diffraction line from (422) plane coinciding with the diffraction line from (226) plane, and if the lattice is strained, the c/a deviates from $(3/2)^{\frac{1}{2}}$, with the diffraction line from (422) plane separating from the diffraction line from (226) plane, providing a higher unloaded Q.

Figure 3:
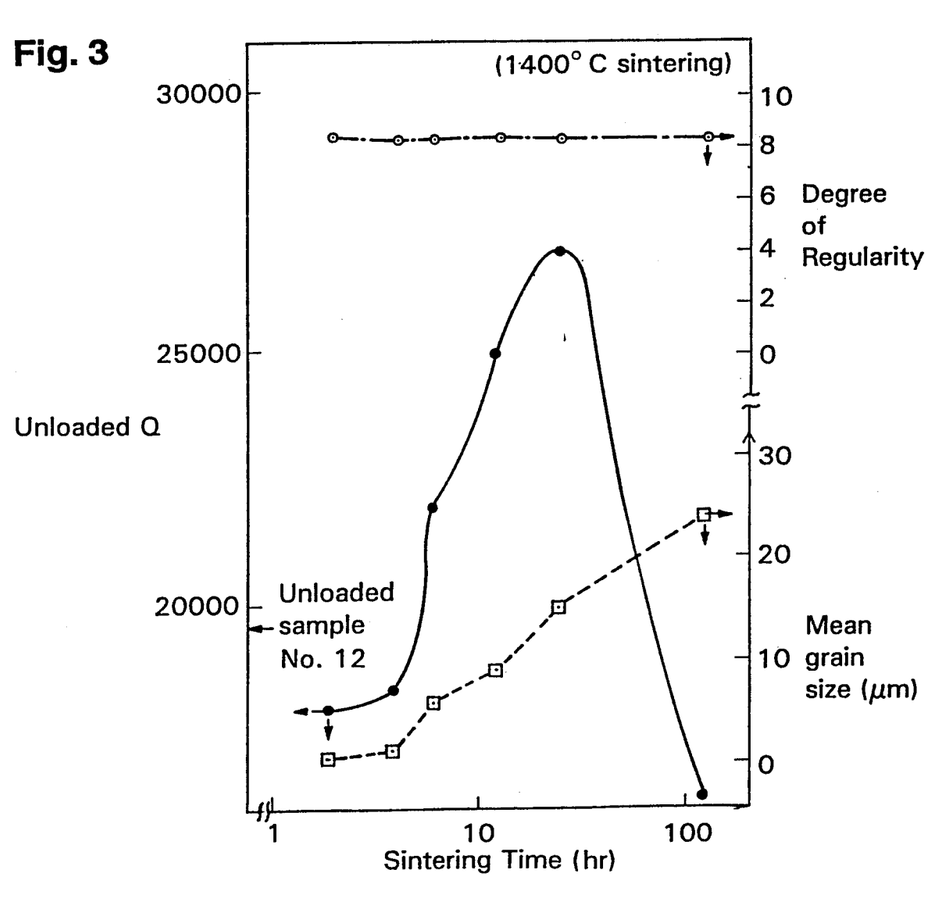
FIG. 3 is a diagram showing the relationship between the sintering time, mean crystal grain size, unloaded Q, and degree of regularity concerning samples prepared in accordance with another embodiment of the dielectric ceramics of the present invention.

FIG. 3 shows the relationship between the sintering time, mean crystal grain size (dotted line), unloaded Q (solid line), and degree of regularity (dashed line) of the samples No. 6 to No. 11.

Figure 4:
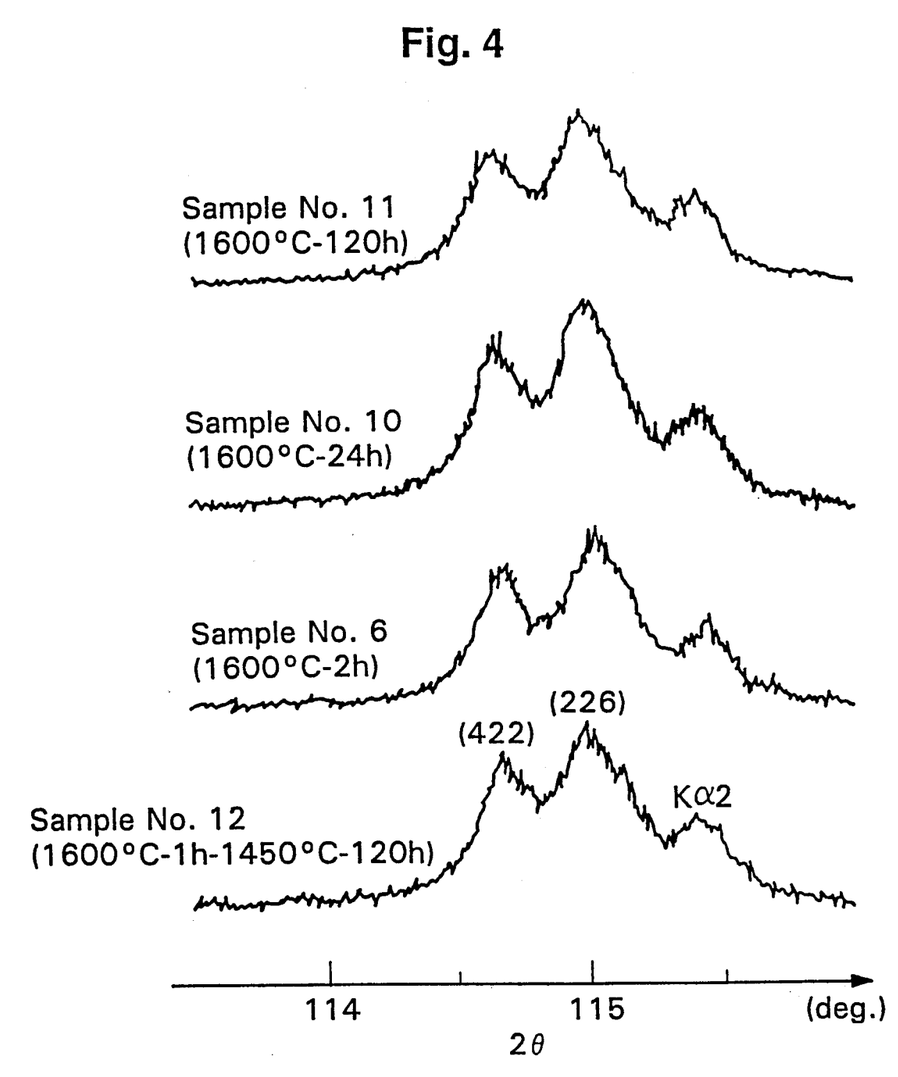
FIG. 4 is a diagram showing the X-ray diffraction patterns of (422) and (226) planes of the powder samples of FIG. 3 treated at typical sintering times.

FIG. 4 shows the X-ray diffraction patterns of (422), (226) planes of the samples of FIG. 3 sintered for typical sintering times.

As can be seen from FIG. 1, the unload Q dramatically improves at sintereing temperatures between 1,580° C. and 1,590° C. and reaches 20,000° at 1,600° C. On the other hand, the degree of regularity decreases with increasing sintering temperature, and the separation between (422) and (226) representing the lattice strain shown in FIG. 2 becomes less noticeable as the sintering temperature rises. At 1,600° C., almost no separation can be observed, but the unloaded Q increases. Regarding the mean crystal grain size, there is noted an abrupt growth of grains, from 2 $\mu m$ to 12.5 $\mu m$, at temperatures between 1,580° C. and 1,590° C., the grain size gradually increasing thereafter with increasing sintering temperature.

As regards the relationship between the unloaded Q and the mean crystal grain size, the abrupt grain growth coincides with the improvement of the unloaded Q, the effect being that the larger the grain size is, the higher the unloaded Q. On the other hand, in the case of the mean crystal grain size smaller than 5 $\mu m$, no difference is noted in unloaded Q as compared with the sample No. 5 prepared based on the conventional concept that the lattice strain is caused by ordering through low-temperature, long-hour sintering.

Although not shown in Table 1 and FIG. 1, in the case of samples sintered at temperatures exceeding 1,600° C., the mean crystal grain size is larger than 20 $\mu m$, and since Zn evaporates rapidly and therefore dense ceramics cannot be obtained (polarity exceeds 7%), the unloaded Q deteriorates and the relative dielectric constant ($\epsilon r$) decreases.

As can be seen from FIG. 3, the degree of regularity reaches an almost completed level after two hours of sintering, and no change is noted even if the sintering time is lengthened. At this time, the separation between (422) and (226), representing the lattice strain shown in FIG. 4, is also clearly observed after two hours of sintering, and almost no change is noted even if the sintering time is lengthened.

Also, as can be seen from FIG. 3, the unloaded Q is improved as the sintering time becomes longer, reaching a maximum of 27,000 at 30 hours, but drops thereafter to the lowest level at 120 hours. On the other hand, the mean crystal grain size increases to 0.1 $\mu m$ after two hours of sintering and becomes larger as the sintering time becomes longer, reaching 24 $\mu m$ at 120 hours. As regards the relationship between the unloaded Q and the mean crystal grain size, the unloaded Q becomes larger as the mean crystal grain size grows up to about 15 $\mu m$, but when the mean crystal grain size exceeds 15 $\mu m$, the unloaded Q begins to deteriorate since the porosity increases and dense ceramics cannot be obtained. Furthermore, when the mean crystal grain size exceeds 20 $\mu m$, the unloaded Q rapidly deteriorates and drops below the level of the sample No. 12 prepared by the prior art method using high-temperature, quick sintering and low-temperature, long-hour heat treatment. Rapid deterioration of the unloaded Q occurs if the mean crystal grain size becomes larger than 20 $\mu m$ or if the porosity becomes greater than 7%. The porosity should preferably be 7% or less in view of hardness, workability, etc.

On the other hand, when the mean crystal grain size is smaller than 5 $\mu m$, the unloaded Q is lower than that of the sample No. 12 prepared by the conventional method. It is believed, though the detailed cause is unknown, that with the mean crystal grain size of 5 $\mu m$ or over, the effect of the grain boundary with respect to the entire sintered body decreases with a resultant reduction in the effect of the crystalline disorder at the grain boundary, thereby enhancing the crystallinity as the entire sintered body and thus increasing the unloaded Q.

It has therefore been proved that in the high-frequency dielectric ceramics containing an oxide of complex perovskite structure as the main component, a greater effect is produced for improvement of the unloaded Q when the mean crystal grain size of the sintered ceramics is controlled to within the range of 5 μm to 20 μm and the porosity not exceeding 7% than when the lattice strain is caused by regulating the said B1 and B2 ions based on the conventional concept. This means that although by enhancing the regularity of the long-range periodic arrangement of the B1 and B2 ions it may be improved and the associated generation of lattice strain, the unloaded Q is much more dependent on the mean crystal grain size of the sintered ceramics.

Therefore, in the high-frequency dielectric ceramics containing an oxide of complex perovskite structure as the main component, the mean crystal grain size of the sintered ceramics is controlled to within the range of 5 μm to 20 μm and the porosity not exceeding 7%.

Although not described in the present example, similar experiments were conducted on ceramics containing other compounds of complex perovskite structure as the main component, and the results showed the same trends as in the ones described in the present example though the effects were more or less different in magnitude.

In this example, the mean crystal grain size and the sintering conditions were varied, but it will be appreciated that the same effects can be obtained by adding additives that do not easily affect the characteristics.

Example 2

High purity BaCO₃, MgO, Ta₂O₅, ZnO, and Nb₂O₅ were weighed out to give the compositions shown in Table 2-1 when expressed by the formula uBaO.v[X-MgO, (1−X) ZnO].w[YNb₂O₅, (1−Y) Ta₂O₅]. The powder was prepared and compacted in the same manner as in Example 1. The sample ceramics were produced by sintering the compacts at temperature of 1,400° to 1,600° C. for 2 to 24 hours (at a heating/cooling rate of 200° C./h).

TABLE 2-1

| Sample Nos | Compositions | | | | |
|---|---|---|---|---|---|
| | u | v | w | x | Y |
| 13 | 0.590 | 0.205 | 0.205 | 0.5 | 0.5 |
| 14 | 0.590 | 0.205 | 0.205 | 0.2 | 0.9 |
| *15 | 0.590 | 0.205 | 0.205 | 0.2 | 0.9 |
| 16 | 0.605 | 0.180 | 0.215 | 0 | 0 |
| 17 | 0.605 | 0.180 | 0.215 | 0 | 1 |
| *18 | 0.605 | 0.180 | 0.215 | 0 | 1 |
| 19 | 0.615 | 0.180 | 0.205 | 0.8 | 0.8 |
| 20 | 0.615 | 0.180 | 0.205 | 0.9 | 0.2 |
| *21 | 0.615 | 0.180 | 0.205 | 0.9 | 0.2 |
| *22 | 0.625 | 0.175 | 0.200 | 0.8 | 0.2 |
| *23 | 0.610 | 0.200 | 0.190 | 0.5 | 0.5 |
| *24 | 0.590 | 0.185 | 0.225 | 1 | 0 |
| *25 | 0.575 | 0.220 | 0.205 | 0.2 | 0.2 |

Next, the mean crystal grain size, porosity, relative dielectric constant (εr), unloaded Q, and temperature characteristic (τf) of resonant frequency of the thus produced samples were measured in the same manner as in Example 1, the results of which are shown in Table 2-2. In Tables 2-1 and 2-2, the sample numbers marked with "*" indicate the samples outside the scope of the present invention.

TABLE 2-2

| Sample Nos | Mean crystal grain size (μm) | Porosity (%) | Unloaded (Q) | Relative dielectric constant (εr) | Temperature characteristic τf (ppm/°C.) |
|---|---|---|---|---|---|
| 13 | 8.7 | 3.4 | 16000 | 29.5 | 6.2 |
| 14 | 14.3 | 3.8 | 14200 | 33.2 | 9.4 |
| *15 | 18.4 | 8.6 | 7500 | 28.2 | 7.7 |
| 16 | 15.5 | 4.5 | 19800 | 29.8 | −1.2 |
| 17 | 17.0 | 5.9 | 13100 | 30.4 | 7.6 |
| *18 | 3.8 | 2.8 | 8900 | 33.5 | 8.0 |
| 19 | 11.1 | 6.4 | 15500 | 30.5 | 7.9 |
| 20 | 15.9 | 2.6 | 23200 | 25.7 | 5.4 |
| *21 | 24.6 | 8.1 | 8200 | 22.8 | 3.1 |
| *22 | | unsintered | | | |
| *23 | 9.4 | 6.8 | 6300 | 26.4 | 5.3 |
| *24 | 12.8 | 4.1 | 3400 | 22.9 | 2.1 |
| *25 | 6.9 | 2.2 | 7100 | 29.4 | 0.5 |

As can be seen from Table 2-2, high-frequency dielectric ceramics having a high unloaded Q can be obtained using the compositions within the scope of the present invention when the mean crystal grain size of the sintered ceramics is controlled to within the range of 5 μm to 20 μm and the porosity not exceeding 7%.

When u>0.620 or w<0.190, the composition shows poor sintering, e.g., the sample No. 22 was unsintered. When u<0.585 or w>0.220, low unloaded Q, low relative dielectric constant (εr), and increased temperature characteristic (τf) of resonant frequency result, which renders the composition unsuitable for practical use. Therefore, such compositions were excluded from the scope of the present invention.

Also, when the mean crystal grain size of the sintered ceramics is larger than 20 μm or when the porosity is greater than 7% even if the mean crystal grain size is within the range prescribed in the present invention, the unloaded Q deteriorates. Therefore, such compositions were excluded from the scope of the present invention.

Moreover, when the mean crystal grain size is smaller than 5 μm, no difference is noted from the prior art. Therefore, such compositions were excluded from the scope of the present invention.

Example 3

High purity BaCO₃, MgO, and Ta₂O₅ were weighed out so that the ceramics of the compositions shown in Table 3 could be obtained, and the thus weighed materials were wet-mixed using a ball mill. The mixture was pre-sintered at 1,000° to 1,200° C. for 2 hours and wet-ground using a ball mill, followed by dehydration and drying. Thereafter, a binder was added to the resulting powder to control the grain size thereof, and the thus prepared powder was dry-pressed at a pressure of 1,000 kg/cm² to form into disks of 7.5 mm in diameter and 4.0 mm in thickness. The thus formed compacts were then sintered under conventional sintering conditions (heating/cooling rate: 200° C./h, sintering temperature: 1,500° to 1,600° C., sintering time: 2 to 24 hours), to obtain the sample ceramics.

The relative dielectric constant (τr), unloaded Q, and temperature characteristic (τf) of resonant frequency of the thus obtained samples were measured at the resonant frequency of 10 GHz, the results of which are shown in Table 3.

TABLE 3

| Sample Nos | Composition (wt %) BaO | MgO | Ta$_2$O$_5$ | Unloaded Q | Relative dielectric constant ($\epsilon_r$) | Temperature characteristic $\tau f$ (ppm/°C.) |
|---|---|---|---|---|---|---|
| 26 | 48.75 | 4.25 | 47.00 | 24200 | 24.5 | +2.6 |
| 27 | 48.75 | 3.85 | 47.40 | 18500 | 23.9 | +1.5 |
| 28 | 48.35 | 3.85 | 47.80 | 9400 | 24.0 | +4.2 |
| 29 | 48.35 | 4.25 | 47.40 | 20600 | 24.4 | −0.4 |
| 30 | 48.60 | 4.10 | 47.20 | 27500 | 24.9 | −1.6 |
| 31 | 48.50 | 4.00 | 47.50 | 29800 | 24.9 | −3.1 |
| 32 | 48.75 | 4.45 | 46.80 | 8700 | 23.6 | −3.2 |
| 33 | 48.50 | 4.40 | 47.10 | 9100 | 24.5 | −1.1 |
| 34 | 48.15 | 4.45 | 47.40 | 7800 | 23.9 | −0.3 |
| 35 | 48.15 | 4.05 | 47.80 | 6700 | 22.1 | +3.7 |
| 36 | 48.20 | 3.70 | 48.10 | 6800 | 23.0 | +8.7 |
| 37 | 48.70 | 3.70 | 47.60 | 8700 | 24.3 | +4.6 |
| *38 | 48.90 | 4.40 | 46.70 | | unsintered | |
| *39 | 48.60 | 4.70 | 46.70 | 900 | 16.4 | −2.0 |
| *40 | 48.05 | 4.70 | 47.25 | 1800 | 19.2 | +4.8 |
| *41 | 47.90 | 3.85 | 48.25 | 1300 | 21.5 | +24.0 |
| *42 | 48.10 | 3.50 | 48.40 | 4800 | 23.1 | +42.0 |
| *43 | 48.80 | 3.40 | 47.80 | 2000 | 14.0 | +20.2 |
| *44 | 48.95 | 3.65 | 47.40 | | unsintered | |
| *45 | 48.82 | 4.28 | 46.90 | | unsintered | |

In Table 3, the sample numbers marked with "*" indicate the samples outside the scope of the present invention.

Figure 5:
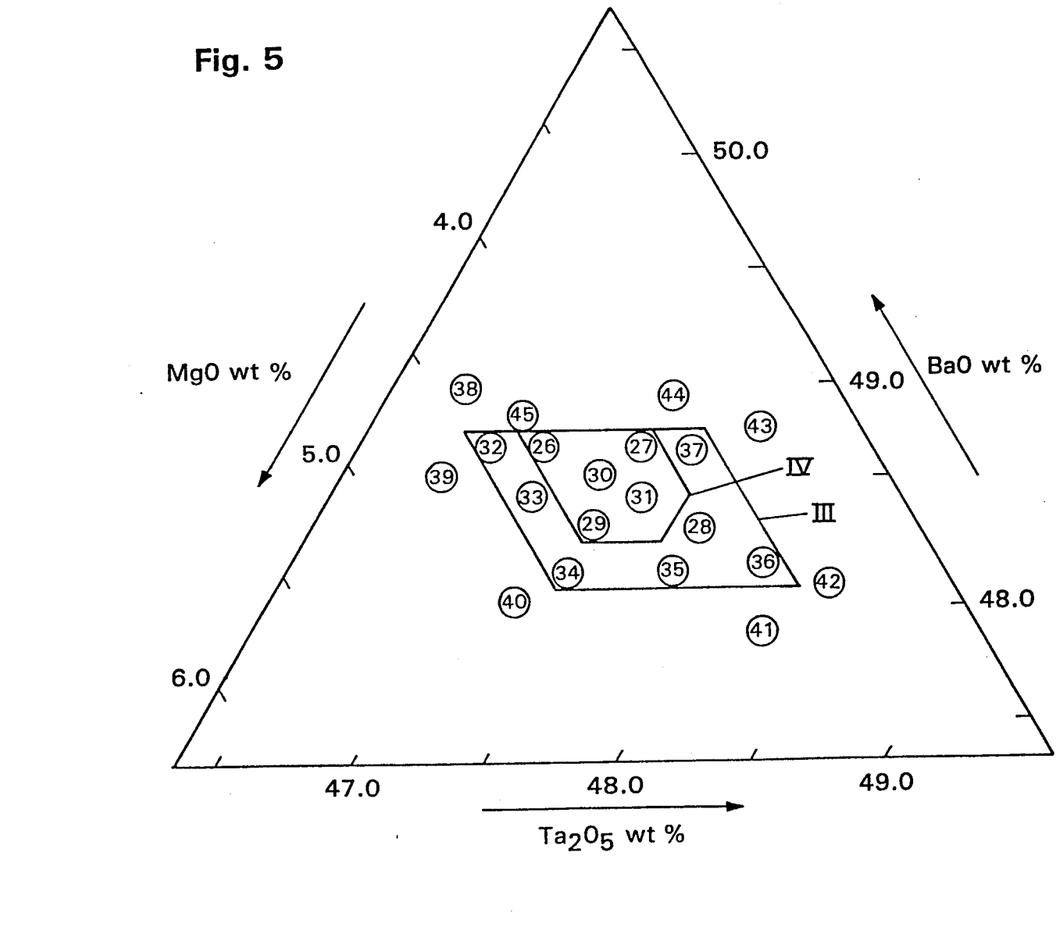
FIG. 5 is a triangular diagram showing the composition range of the dielectric ceramics according to a third embodiment of the present invention.

FIG. 5 is a triangular diagram showing the composition ranges, III and IV, of the present invention. The numbers in FIG. 5 correspond to the sample numbers in Table 3 and represent the compositions of the corresponding samples.

As is apparent from Table 3, it is obvious that within the scope of the composition range III, ceramics of high unloaded Q can be obtained using a conventional sintering method. Among others, within the scope of the composition range IV, ceramics of particularly high unloaded Q can be obtained. Examination by X-ray diffraction showed that the regularity of arrangement reached an almost completed level after a short-time sintering of 2 hours at 1,600° C.

Regarding those outside the above scopes, if BaO exceeds 48.8 wt %, no sintering occurs (sample Nos. 38, 44, 45), and if it is less than 48.1 wt %, the unloaded Q is low and the temperature characteristic ($\tau f$) increases (sample Nos. 40, 41). Also, if MgO exceeds 4.5 wt %, the sintering characteristics deteriorate, resulting in a reduced relative dielectric constant ($\epsilon_r$) and a low unloaded Q (sample Nos. 39, 40). On the other hand, if it is less than 3.6 wt %, the temperature characteristic ($\tau f$) increases (sample Nos. 42, 43). Because of these and other shortcomings, such compositions do not satisfy the object of the present invention.

According to the composition range III, sintering characteristics are dramatically improved and a high degree of densification is readily and stably achieved using a conventional sintering method; therefore, dielectric ceramics containing a complex perovskite compound as the main component and having a high unloaded Q of 5,000 or over at 11 GHz can be obtained.

When the composition range is restricted to the composition range IV, the high density (higher than 97% of theoretical density) ceramics can reach a sufficient level of regularity with a very short heat treatment of 10 minutes to 50 hours. As a result, dielectric ceramics containing a complex perovskite compound as the main component and having an unloaded Q of 10,000 or over at 11 GHz can be obtained without requiring heat treatment of long duration.

It was also confirmed within the composition range III that the sintering characteristics can be improved by adding a small amount of additive, without causing substantial deterioration of the material properties. For example, when 0.02 wt % SiO$_2$ was added to the sample No. 32, no substantial change in the properties was noted although the sintering temperature dropped by about 80° C. The same effects can be expected of other additives.

Powder composed of the theoretical composition of Ba(Mg$_\frac{1}{3}$Ta$_\frac{2}{3}$)O$_3$, a composition outside the composition range III, was prepared under the same conditions as above and a plurality of compacts were sintered by the rapid heating method and subjected to heat treatment. The resulting samples showed a large variation in the sintered density along with the formation of cracks, causing the unloaded Q to vary over a wide range of 2,000 to 18,000. On the other hand, when a plurality of compacts having the same composition as the sample No. 31 were sintered using a conventional sintering method, a high and stable unloaded Q of 28,000 to 32,000 was obtained.

As will be apparent to those skilled in the art, according to the present invention, the same effects can be obtained by replacing any one of Ba, Mg, or Ta with other element to alter the temperature characteristic ($\tau f$) of resonant frequency or by adding an additive.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A dielectric ceramic having high unloaded Q in high frequency ranges containing as its main component a complex perovskite compound consisting essentially of BaO, MgO, and Ta$_2$O$_5$, the composition range thereof being in the range of 48.3 to 48.8% by weight for BaO and in the range of 3.8 to 4.3% by weight for MgO, and the remaining percentage for Ta$_2$O$_5$ in the range of 46.9 to 47.7% by weight.

2. A dielectric ceramic having high unloaded Q in high frequency ranges according to claim 1, wherein said unloaded Q value is in the range of 13,100 to 29,800.

3. A dielectric ceramic having high unloaded Q in high frequency ranges according to claim 1, wherein said unloaded Q value is in the range of 18,500 to 29,800.

4. A dielectric ceramic having high unloaded Q in high frequency ranges according to claim 1, wherein said ceramic is dry-pressed under high pressure and then sintered.

5. A dielectric ceramic having high unloaded Q in high frequency ranges according to claim 2, wherein said ceramic is dry-pressed under high pressure and then sintered.

6. A dielectric ceramic having high unloaded Q in high frequency ranges according to claim 3, wherein said ceramic is dry-pressed under high pressure and then sintered.

7. A dielectric ceramic having high unloaded Q in high frequency ranges containing as its main component an oxide of a complex perovskite structure consisting essentially of a compound represented by the formula:

$$Ba[(Mg_xZn_{1-x})_{\frac{1}{3}}(Nb_yTa_{1-y})_{\frac{2}{3}}]O_3,$$

where $0 \leq x < 1$, $0 < y \leq 1$, and having a mean crystal grain size of sintered ceramic controlled to within the range of 5 μm to 20 μm and a porosity not exceeding 7%.

8. A dielectric ceramic having high unloaded Q in high frequency ranges according to claim 7, wherein said unloaded Q value is in the range of 13,100 to 29,800.

9. A dielectric ceramic having high unloaded Q in high frequency ranges according to claim 7, wherein said unloaded Q value is in the range of 17,800 to 27,000.

10. A dielectric ceramic having high unloaded Q in high frequency ranges according to claim 7, wherein said ceramic is dry-pressed under high pressure and then sintered.

11. A dielectric ceramic having high unloaded Q in high frequency ranges according to claim 8, wherein said ceramic is dry-pressed under high pressure and then sintered.

12. A dielectric ceramic having high unloaded Q in high frequency ranges according to claim 9, wherein said ceramic is dry-pressed under high pressure and then sintered.

13. A dielectric ceramic having high unloaded Q in high frequency ranges containing as its main component the oxide of a complex perovskite structure consisting essentially of a compound represented by the formula:

$$uBaO-V[xMgO, (1-x)ZnO]-w[yNb_2O_5, (1-y)Ta_2O_5],$$

where $0 \leq x \leq 1$, $0 \leq y \leq 1$, $0.585 \leq u \leq 0.620$, $0.160 \leq v \leq 0.220$, $0.205 \leq w \leq 0.220$, and $u+v+w=1$, and having a mean crystal grain size of sintered ceramic controlled to within the range of 5 μm to 20 μm and a porosity not exceeding 7%.

14. A dielectric ceramic having high unloaded Q in high frequency ranges according to claim 12, wherein said unloaded Q value is in the range of 13,000 to 29,800.

15. A dielectric ceramic having high unloaded Q in high frequency ranges according to claim 12, wherein said unloaded Q value is in the range of 13,100 to 23,200.

16. A dielectric ceramic having high unloaded Q in high frequency ranges according to claim 13, wherein said ceramic is dry-pressed under high pressure and then sintered.

17. A dielectric ceramic having high unloaded Q in high frequency ranges according to claim 14, wherein said ceramic is dry-pressed under high pressure and then sintered.

18. A dielectric ceramic having high unloaded Q in high frequency ranges according to claim 15, wherein said ceramic is dry-pressed under high pressure and then sintered.

* * * * *